United States Patent [19]
Garg et al.

[11] Patent Number: 5,277,987
[45] Date of Patent: Jan. 11, 1994

[54] HIGH HARDNESS FINE GRAINED BETA TUNGSTEN CARBIDE

[75] Inventors: Diwakar Garg, Macungie; Paul N. Dyer, Allentown; Robert E. Stevens, Emmaus; Christopher Ceccarelli, Whitehall, all of Pa.

[73] Assignee: Air Products and Chemicals, Inc., Allentown, Pa.

[21] Appl. No.: 649,647

[22] Filed: Feb. 1, 1991

[51] Int. Cl.⁵ .................................................. B05B 15/04
[52] U.S. Cl. .................................... 428/457; 427/249; 427/255.2; 427/294; 427/405; 427/419.7; 428/698; 428/699
[58] Field of Search ............ 427/249, 405, 255.2, 427/294, 419.7; 428/698, 457, 699

[56] References Cited

U.S. PATENT DOCUMENTS

| | | | |
|---|---|---|---|
| 3,368,914 | 2/1968 | Darnell et al. | 117/71 |
| 3,389,977 | 6/1968 | Tarver | 29/198 |
| 3,574,672 | 4/1971 | Tarver | 117/106 |
| 3,814,625 | 6/1974 | Lewis et al. | 117/71 |
| 4,162,345 | 7/1979 | Holzl | 428/328 |
| 4,427,445 | 1/1984 | Holzl et al. | 75/234 |
| 4,855,188 | 8/1989 | Garg et al. | 428/627 |
| 4,874,642 | 10/1989 | Garg et al. | 427/249 |

FOREIGN PATENT DOCUMENTS 1326769 8/1973 United Kingdom .
1540718 2/1979 United Kingdom .

*Primary Examiner*—Bernard Pianalto
*Attorney, Agent, or Firm*—Keith D. Gourley; James C. Simmons; William F. Marsh

[57] ABSTRACT

An extremely hard, fine grained tungsten carbide produced by thermochemical deposition is described. The tungsten carbide consists primarily of substantially pure tungsten carbide wherein the tungsten carbide consists of $WC_{1-x}$, where x is 0 to about 0.4. The disclosed tungsten carbide is free of columnar grains and consists essentially of extremely fine, equiaxial crystals. Also disclosed is a method of producing the disclosed material.

10 Claims, 5 Drawing Sheets

HIGH HARDNESS FINE GRAINED BETA TUNGSTEN CARBIDE

FIELD OF THE INVENTION

This invention relates to high hardness, fine grained tungsten carbide in the form of cubic $WC_{1-x}$, where x is 0 to about 0.4 and to a process for producing the same.

BACKGROUND OF THE INVENTION

High hardness materials are widely used as coatings on various types of mechanical components and cutting tools. Such coatings impart wear and erosion resistance and thus increase the wear and erosion life of objects that have been coated. The high hardness materials can also be used to produce free standing objects which are wear resistant.

Chemical vapor deposition processes can be used to produce high hardness coatings and high hardness free standing objects. In a typical chemical vapor deposition (CVD) process the substrate to be coated is heated in a suitable chamber and then a gaseous reactant mixture is introduced into the chamber. The gaseous reactant mixture reacts at the surface of the substrate to form a coherent layer of the desired coating. By varying the gaseous reactant mixture and the CVD process parameters, various types of deposited coatings can be produced.

Deposits produced by CVD, both for coating substrates and for producing free standing objects, have suffered certain drawbacks. Although the hardness of the deposits has been satisfactory, the strength and toughness of the materials has often been lower than desired. This lack of strength and toughness is due in large part to the grain size, crystallite size, and structure of the compounds that make up the deposit. Unfortunately, regardless of tile components of the gaseous reactant mixture, typical CVD techniques produce coatings having relatively large grains which are arranged in columns. Thus, cross-sectional metallographic examination of a typical CVD deposit will show grains usually in excess of several microns in size which are arranged in columns that extend perpendicularly to the substrate surface. Such deposits are typically quite brittle since adjacent columns of grains result in long interstitial regions of weakness. Such regions are easily fractured and attacked by corrosive agents and erosive media. Because of the columnar grain structure, such deposits also have poor surface finish and poor wear and erosion resistance properties.

U.S. Pat. No. 4,162,345, issued Jul. 24, 1979 to Robert A. Holzl, discloses a method for producing deposits of tungsten and carbon or molybdenum and carbon which results in deposits characterized by a structure which is free of columnar grains and instead consists essentially of fine, equiaxial grains. These deposits have unusually high hardness and tensile strength. The Holzl patent discloses use of temperatures varying from 650° C. to 1100° C., which are high enough to severely degrade the mechanical properties of various carbon steels, stainless steels, nickel alloys, titanium alloys and cemented carbide.

In the method of the Holzl '345 patent, a sequence of events is made to take place which, although similar to conventional chemical vapor deposition, is not truly that. The Holzl method employs a reactor which is essentially similar to a chemical vapor deposition reactor. However, according to the Holzl method the apparatus is operated in such a manner that the typical chemical vapor deposition process does not take place. Typical chemical vapor deposition involves a single reaction by the gases in the reactor at the surface of the substrate resulting in the formation of a solid phase deposit directly on the substrate surface. On the other hand, the Holzl '345 patent describes a deposition process involving at least two distinct reaction steps. According to the Holzl method, an initial reaction is caused to take place displaced from the surface of the substrate. This reaction involves a decomposition or partial reduction of a fluoride of tungsten (preferably $WF_6$) by a substitution reaction with an oxygen or oxygen-containing group derived from a gaseous organic compound containing hydrogen, carbon and oxygen. Subsequent reaction with hydrogen gas results in the formation of the final deposits. The material of the Holzl '345 patent is a hard metal alloy, consisting primarily of tungsten and carbon. X-ray diffraction analysis of the '345 alloy shows that the deposit is akin to tungsten but with a very finely dispersed carbide, probably in the form of WC. The Holzl patent discloses use of temperatures varying from 650° C. to 1100° C., which are high enough to severely degrade the mechanical properties of various carbon steels, stainless steels, nickel alloys, titanium alloys and cemented carbide.

U.S. Pat. No. 4,427,445, issued Jan. 24, 1984 to Robert A. Holzl, et al. also discloses a hard fine grained material which can be produced by thermochemical deposition, but at temperatures lower than those described in the examples of the '345 patent. Thus, where there are large differences in the thermal coefficients of expansion between the substrate material and the coating material, the '445 methodology reduces adhesion problems and problems associated with mechanical distortion, metallurgical transformation or stress relief of the substrate. The material of the '445 Holzl, et al. patent is a tungsten carbon alloy consisting primarily of a two phase mixture of substantially pure tungsten and an A15 structure.

U.S. Pat. No. 3,368,914, discloses a process for adherently depositing tungsten carbide of substantial thickness on steel and other metal substrates. The process involves first diffusing another metal on the surface of the substrate to relax the thermal expansion coefficient zone of the metal substrate. The carbide coating is then deposited on the diffused surface by CVD. The process claims it is preferable to diffuse the metal forming the carbide into the substrate. In one embodiment of the claimed process, a thin layer of W is deposited on the metal surface using 600°–1000° C. temperature. After coating W, the temperature is increased to approximately 1000°–1200° C. and held there for a significant period of time to permit diffusion of W into the metal. The diffused surface is then coated with tungsten carbide using $WF_6$, CO and $H_2$. In the alternative embodiment, a pack diffusion technique is used for achieving diffusion of W into metal. Temperature ranging from 1000°–1200° C. is used in the pack diffusion step. The diffused metal surface is then coated with tungsten carbide.

U.S. Pat. No. 3,389,977, discloses a method of depositing substantially pure tungsten carbide in the form of $W_2C$, free from any metal phase. Pure $W_2C$ is deposited on a substrate by reacting $WF_6$ and CO. The substrate is heated to a temperature in excess of 400° C. The adherence of $W_2C$ to steel is improved by first cleaning the surface and then depositing with a thin film of W followed by W$_2$C using a temperature ranging from 600°-1000° C. Since initial deposition of tungsten is lo conducted at or above 600° C., the '977 process is not feasible for providing erosion and wear resistance coating on various carbon steels, stainless steels, nickel and titanium alloys without severely degrading their mechanical properties. Additionally pure W$_2$C deposited according to the teachings of the '977 patent consists of columnar grains. The '977 patent does not describe a process for depositing tungsten carbide coating having a non-columnar microstructure.

U.S. Pat. No. 3,574,672 discloses a process for depositing W$_2$C by heating a substrate to a temperature between 400°-1300° C. The process described in this patent is essentially the same as disclosed in U.S. Pat. No. 3,389,977.

U.S. Pat. No. 3,721,577 discloses a process for depositing refractory metal or metal carbides on ferrous and non-ferrous base materials heated to at least 1050° C. The metal carbides are deposited using halide vapors of the metal along with methane and hydrogen.

U.S. Pat. No. 3,814,625 discloses a process for the formation of tungsten and molybdenum carbide by reacting a mixture of WF$_6$ or MoF$_6$, benzene, toluene or xylene and hydrogen. The process is carried out under atmospheric pressure and temperatures ranging from 400°-1000° C. An atomic ratio of W/C in the gaseous mixture varying from 1 to 2 is required to yield W$_2$C. The process also suggests that for some substrates such as mild steel, it is advantageous in providing better adhesion to deposit a layer of nickel or cobalt prior to tungsten carbide deposition. The process also claims the formation of a mixture of tungsten and tungsten carbide in the presence of large proportions of free hydrogen. The mixture of W and W$_2$C coating deposited according to the teaching of the '625 patent consists of columnar grains. The '625 patent does not disclose a process for depositing a tungsten carbide coating in non-columnar fashion.

British Patent 1,326,769 discloses a method for the formation of tungsten carbide by reacting a mixture of WF$_6$, benzene, toluene or xylene and hydrogen under atmospheric pressure and temperatures ranging from 400°-1000° C. The process disclosed in this patent is essentially the same as disclosed in U.S. Pat. No. 3,814,625.

British Patent 1,540,718 discloses a process for the formation of W$_3$C using a mixture of WF$_6$, benzene, toluene or xylene and hydrogen under sub-atmospheric pressure and temperature ranging from 350°-500° C. An atomic ratio of W/C in the gaseous mixture varying from 3-6 is required to yield W$_3$C. The coating deposited according to the teaching of British Patent 1,540,718 consists of columnar grains. The British '718 patent does not teach a process for depositing a non-columnar coating.

The methods of the Holzl patents cited above have been useful in producing fine-grained tungsten/carbon alloys containing mixtures of N and WC, and N and A15 structure, and the methods described in other cited patents have been successful in producing columnar W$_3$C or W$_2$C or mixtures of W and W$_2$C. The method of the presently claimed invention is one in which an extremely hard, fine-grained, non-columnar substantially pure tungsten carbide coating is deposited on a substrate. Prior art methods for depositing similar non-columnar coatings are disclosed and claimed in a number of recently issued patents.

U.S. Pat. No. 4,874,642, issued Oct. 17, 1989 to Diwakar Garg et al. discloses and claims coatings comprising non-columnar tungsten-carbide alloys containing mixtures of tungsten and true carbides in the form of W$_2$C or W$_3$C or a mixture of W$_2$C and W$_3$C. The disclosed tungsten/carbon alloys are free of columnar grains and consist essentially of extremely fine, equiaxial crystals. The deposits are produced at temperatures in the range of 300° to 650° C. Such alloys have been found to be especially useful since the presence of the W$_2$C and/or W$_3$C carbides in non-columnar microstructure contributes to both the hardness and the tensile strength of the deposited materials.

In U.S. Pat. No. 4,855,188, issued Aug. 8, 1989 to Diwakar Garg et al, filed Feb. 8, 1988, a highly erosive and abrasive wear resistant composite coating system is described in which an intermediate layer of substantially pure tungsten Is deposited prior to depositing tungsten/carbon alloy coating. The outer tungsten/carbon alloy layer is comprised of a mixture of tungsten and tungsten carbide, with the tungsten carbide phase comprising of W$_2$C, W$_3$C or a mixture of both. The thickness of the intermediate tungsten layer is controlled in a manner to reduce or eliminate micro-cracks in the composite coating system and confer substantial erosive and abrasive wear characteristics on the composite coating system. The ratio of the thickness of the inner tungsten layer to the thickness of the outer tungsten/carbon alloy layer is at least above 0.3 in the cases Of W+W$_3$C, W+W$_2$C+W$_3$C and W+W$_2$C coatings. Additionally, the ratio of the thickness of the inner layer to the thickness of the outer layer to get optimum erosion and abrasion wear performance is at least 0.35 in the case of mixtures of tungsten and W$_2$C in the outer layer, 0.60 in the case of mixtures of tungsten and W$_3$C in the outer layer and, 0.35 in the case of mixtures of tungsten and W$_2$C and W$_3$C in the outer layer.

While such alloy coatings of the Garg et al patents have excellent wear resistance, the presently claimed coatings have significantly improved wear resistance over such prior art non-columnar coatings in both humid and lubricated environments.

SUMMARY OF THE INVENTION

The present invention is directed to a hard, fine-grained product of tungsten and carbon being essentially free of columnar grains and consisting essentially of a substantially pure cubic tungsten carbide characterized by the formula WC$_{1-x}$, where x ranges from 0 to about 0.4. According to the method for producing the cubic tungsten carbide of this invention, the tungsten carbide is deposited via chemical vapor deposition (CVD) on a substrate under sub-atmospheric pressure to slightly atmospheric, i.e. within the range of about 1 Torr. to about 1000 Torr., at a temperature of about 300° to about 650° C. and using a mixture of process gases comprising a tungsten halide, hydrogen, and an oxygen- and hydrogen-containing organic compound.

By conjunctively controlling the processing parameters of W/C atomic ratio, the ratio of hydrogen to tungsten halide and the partial pressure of the oxygen- and hydrogen-containing organic compound, pure tungsten carbide in the form of WC$_{1-x}$ having a non-columnar microstructure can be formed. More specifically, by conjunctively controlling these operating parameters, especially the reaction temperature within the range of about 300° to about 650° C., preferably about 350° to about 550° C., the feed rate of tungsten halide to the oxygen- and hydrogen-containing organic compound to control the W/C atomic ratio within the range from about 0.5 to about 1.4 and the hydrogen to tungsten halide ratio to more than the stoichiometeric amount required for the reduction of tungsten halide, preferably within the range of about 2 to about 20, and more preferably within the range of about 2 to about 10 and by carefully controlling the partial pressure of said oxygen- and hydrogen-containing organic compound with prescribed limits it is possible to produce the pure cubic $WC_{1-x}$ and to suppress the production of W and $W_2C$, W and $W_3C$, or W, $W_2C$ and $W_3C$.

DETAILED DESCRIPTION OF THE INVENTION

Figure 1:
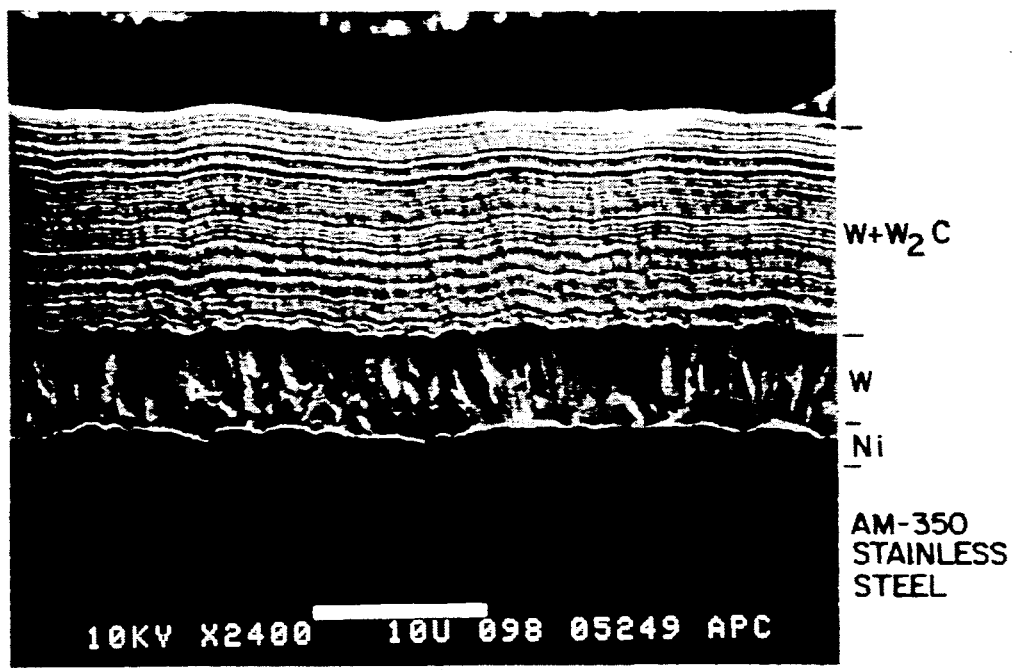
FIG. 1 is a photomicrograph, magnified 2400 times, of an etched cross section of a prior art coating comprising a ~51μm thick intermediate layer of columnar tungsten followed by ~14μm thick non-columnar outer coating of W plus $W_2C$ on AM-350 stainless steel.

The present invention is directed to a novel non-columnar tungsten carbide consisting essentially of substantially pure tungsten carbide in the form of $WC_{1-x}$, where x is 0 to about 0.4. The extremely fine equiaxial grains of this form of tungsten carbide average about one micron or less in size. In cross-section, the tungsten carbide of the present invention exhibits a well defined non-columnar microstructure. It is essentially free of columnar grains and thus is more resistant to corrosion, wear and erosion than are prior art alloys composed of columnar grains. In fact, the non-columnar tungsten carbide products of the present invention exhibited substantial improvements in wear resistance properties in both lubricated and unlubricated environments over the previous non-columnar tungsten carbide alloys of the prior art which had been found to be substantially superior to alloys composed of columnar grains.

The method of the present invention is based on the surprising discovery that deposits of pure tungsten carbide in the form of $WC_{1-x}$, in a fine grain, non-columnar microstructure can be produced by not only controlling the temperature of the reaction but also by controlling the W/C atomic ratio, the ratio of the hydrogen to tungsten halide and partial pressure of the oxygen- and hydrogen-containing organic compound. Since the various operating parameters can be interdependent, the operating parameters should be conjunctively controlled. As used herein the term "conjunctively controlled" means that the operating parameters as whole are controlled; in other words, the effect of a change in one parameter will be used in determining the operating values for the remaining parameters. For example, a change in the reaction temperature may necessitate a change in the ratio of tungsten halide to the oxygen- and hydrogen-containing organic compound.

By carefully selecting appropriate combinations of reaction temperature, the W/C atomic ratio, the ratio of hydrogen to tungsten halide and the partial pressure of the organic compound, one is able to obtain the non-columnar coating having the form of $WC_{1-x}$ rather than the prior art tungsten carbide alloys of W and $W_2C$, W and $W_3C$, or W and $W_2C$ and $W_3C$. Additional refinement of the coating of this invention can be made by producing the alloys in the presence or absence of a diluent or inert gas such as argon, nitrogen and helium.

Turning now to preferred process conditions for making the pure cubic $WC_{1-x}$ tungsten carbide of the present invention, with regard to pressure within the reaction vessel, preferred pressure is usually sub-atmospheric, down to 1 Torr., or up to slightly above atmospheric pressure, 1000 Torr, more preferably the pressure ranges from 20 to 100 Torr.

With regard to the reaction temperature, temperatures of about 300° to about 650° C. are preferred; temperatures in the range of about 400° to about 480° C. are especially preferred.

With regard to the tungsten halide component of the reaction mixture, according to the method of the invention, tungsten fluorides are preferred. Tungsten hexafluoride ($WF_6$) is especially preferred.

With regard to the oxygen- and hydrogen-containing organic compound, preferred compounds are selected from group consisting Of $C_1$-$C_4$ alcohols and aldehydes, $C_2$-$C_4$ ethers, epoxides and ketenes and $C_3$-$C_4$ ketones, For example, methanol, formaldehyde, ethanol, dimethyl ether, diethyl ether, ketene (carbomethane), acetaldehyde, ethylene oxide, vinyl alcohol, acetone, acrolein, allyl alcohol, methyl ethyl ether, isopropyl alcohol, n-propyl alcohol, propylene oxide, propene oxide, propiolaldehyde, propionaldehyde, 2-propyne-1-ol, 3-methoxy propyne, vinyl ether, diethyl ether, furan, tetrahydrofuran, crotonaldehyde, and a-methyl acrolein. Especially preferred are the two or four carbon and one oxygen-containing organic compounds, such as dimethyl ether (DME) and diethyl ether (DEE).

Due to the interdependency of the various operating parameters it is to be expected that the operating range of the tungsten halide to oxygen- and hydrogen-containing organic compound ratio or W/C atomic ratio may change depending on the reactivity and the number of carbon atoms in such an organic compound. For example, it has been found that it is critical that the partial pressure of dimethyl ether, with two carbon atoms be maintained within the range of about 1 to about 2 Torr. at W/C ratios of 0.2 to 1.4 when the total pressure is 40 Torr. On the other hand, the partial pressure of diether ether, with twice the number of carbon atoms, must be substantially lower, i.e. within the range of 0.1 to about 1 for the same W/C ratio when the total pressure is 40 Torr. The partial pressure of the organic compound is maintained proportional to the total pressure of the deposition. For example with dimethyl ether, the partial pressure is in the range of about 0.5 to about 1.0 Torr when the total pressure is 20 Torr to about 2.5 to about 5 when the total pressure is 100 Torr. Similarly with diethyl ether, the partial pressure is in the range of about 0.05 to about 0.5 Torr when the total pressure is 20 Torr to about 0.25 to about 2.5 when the total pressure is 100 Torr.

The tungsten carbide of the present invention can be deposited on a number of ferrous metals and alloys such as cast iron, carbon steels, stainless steels and high speed steels, non-ferrous metals and alloys such as copper, nickel, platinum, rhodium, titanium, aluminum, silver, gold, niobium, molybdenum, cobalt, tungsten, rhenium, copper alloys, nickel alloys such as Inconel and monel, titanium alloys such as Ti/Al/V, Ti/Al/Sn, Ti/Al/Mo/V, Ti/Al/Sn/Zn/Mo, Ti/Al/V/Cr, Ti/Mo/V/Fe/Al, Ti/Al/V/Cr/Mo/Zr and Ti/Al/V/Sn alloys, non-metals such as graphite, carbides such as cemented carbide, and ceramics such as silicon carbide, silicon nitride, alumina, etc. In depositing tungsten carbide of the present invention on reactive substrate materials, such as cast irons, carbon steels, stainless steels, high speed steels, titanium and titanium alloys, aluminum and aluminum alloys, and nickel alloys, it is preferred to coat the substrate first with a more noble material such as nickel, cobalt, copper, silver, gold, platinum, palladium or iridium, by electrochemical or electroless techniques or by physical vapor deposition such as sputtering. However, no deposition of noble material is required for coating non-reactive materials such as copper, nickel, cobalt, silver, gold, platinum, rhodium, niobium, molybdenum, tungsten, rhenium, graphite, carbides and ceramics. Free standing parts of tungsten/carbon alloys of the present invention can be made by depositing the alloy on substrates such as copper, nickel, cobalt, silver, gold, molybdenum, rhenium, and graphite and then removing these substrates by grinding and chemical or electrochemical etching.

A columnar intermediate layer of tungsten can be deposited between the substrate and the coating of the present invention to improve the adhesion and erosive properties of the coating. The intermediate layer of tungsten is produced by chemical vapor deposition under sub-atmospheric to slightly atmospheric pressure, i.e., within the range of about 1 Torr. to about 1,000 Torr., at a temperature of about 300° to about 650° C., using a mixture of tungsten halide such as WF$_6$, an inert gas such as argon, and hydrogen. The intermediate layer of tungsten is of sufficient thickness to reduce or eliminate micro-cracks in the overall coating and to confer substantial erosive and abrasive wear resistant characteristics to the overall coating system.

The tungsten carbide of the present invention can also be deposited on the prior art non-columnar deposits of mixtures of W+W$_2$C, W+W$_3$C, and W+W$_2$C+W$_3$C of the type disclosed in U.S. Pat. No. 4,874,642.

The examples which follow illustrate the process and the product of the present invention. In theses examples a number of flat specimens made of AM-350 stainless steel, AM-355 stainless steel, IN-718 Inconel and titanium alloy such as Ti/6Al/4V were used to deposit the coating of the present invention. A number of SS-422 stainless steel and AM-355 stainless steel discs were also used in a few experiments. The stainless steel flat specimens and discs as well as IN-718 Inconel flat specimens were electroplated with 2-5Km thick nickel before depositing the present coating to protect them from the attack of hot and corrosive HF acid gas produced as a by-product in the CVD process. Specimens made of titanium alloys such as Ti/6Al/4V, on the other hand, were plated with 2-5μm thick nickel using an electroless technique described in detail in U.S. Pat. No. 4,902,535 before coating.

Examples 1 through 5 and 14, as controls, illustrate the production of prior art tungsten and tungsten carbide coatings consisting of non-columnar grains. The WC$_{1-x}$ coatings consisting of non-columnar grains of the present invention are illustrated in Examples 6-13 and 15. Example 16 illustrate the wear performance of the prior art tungsten/carbon alloy (W+W$_2$C) and the WC$_{1-x}$ of the present invention.

EXAMPLES

Control Examples 1-5 Describing Deposition of a Mixture of Tungsten and Tungsten Carbide Coatings

Example 1

Several preplated Ti/6Al/4V and AM-350 stainless steel flat specimens and AM-355 stainless steel discs were placed in an inductively heated graphite furnace inside a gas-tight quartz envelope. The Ti/6Al/4V flat specimens had been preplated with ~3μm thick nickel using an electroless plating technique prior to placing them in the furnace; whereas, the flat stainless steel specimens and discs had been electroplated with ~3μm thick nickel. The preplated flat specimens and discs were heated to 460° C. in flowing argon gas in run #98. At the reaction temperature a gaseous mixture of 300 sccm of WF$_6$, 3,000 sccm of hydrogen and 6,525 sccm of argon was passed into the furnace over the specimens and discs for 10 minutes to coat them with tungsten. After depositing them with tungsten a gaseous mixture of 300 sccm of WF$_6$, 3,000 sccm of H$_2$, 435 sccm of argon and 100 sccm of DME was passed into the furnace for 40 minutes to deposit tungsten carbide. The total pressure within the system was maintained at 40 Torr. The W/C atomic ratio and partial pressure of DME used during the tungsten carbide reaction was 1.5 and 1.04 Torr, respectively. Additionally, the H$_2$/WF$_6$ ratio was 10.0. The coated specimens and discs were then heat treated at the reaction temperature for 1 hour under flowing argon gas.

The specimens and discs were coated with a bright, smooth, adherent and coherent ~5[μm thick columnar tungsten followed by ~14μm thick non-columnar, layered tungsten/tungsten carbide, as shown in FIG. 1. The tungsten/tungsten carbide top coat consisted of a mixture of W and W$_2$C, as determined by XRD.

This example shows that the use of H/C atomic ratio of 1.5 and/or a DME partial pressure of 1.04 Torr during tungsten carbide deposition result in the formation of a mixture of W and W$_2$C.

Example 2

A number of preplated Ti/6A]/4V, SS-422 stainless steel, IN-718 Inconel flat specimens and SS-422 and AM-355 stainless steel discs were heated in the reactor described in Example 1. The flat specimens and discs had been preplated with ~3μm thick nickel using the techniques described in Example 1. They were then coated at 460° C. and 40 Torr with tungsten for 20 minutes using 250 sccm of WF$_6$, 2,500 sccm of hydrogen and 8,700 sccm of argon in run #145. After depositing tungsten they were coated further with tungsten carbide for 65 minutes using 300 sccm of WF$_6$, ,000 sccm of H$_2$, 2,610 sccm of argon and 90 sccm of DME. The total pressure once again was maintained at 40 Torr during the reaction. These conditions provided H$_2$/WF$_6$ ratio of 10.0, W/C atomic ratio of 1.67 and DME partial pressure of 0.60 Torr. After the deposition reaction the coated specimens and discs were heat treated for 1 hour at the deposition temperature under flowing argon gas.

The specimens and discs were coated with a bright, smooth, adherent and coherent ~9μm thick columnar tungsten followed by ~13μm thick non-columnar, layered tungsten/tungsten carbide. The coating was absolutely free of cracks. The microstructure of the coating was similar to the one shown in FIG. 1. The top coat consisted of a mixture of W and W$_2$C, as determined by XRD.

This example shows that the use of W/C atomic ratio of 1.67 and/or DME partial pressure of 0.6 Torr during tungsten carbide deposition reaction result in the formation of a mixture of W and W$_2$C.

Example 3

A number of Ti/6Al/4V, IN-718 Inconel, AM-350 stainless steel and AM-355 stainless steel flat specimens preplated with ~3μm thick nickel were heated in a furnace using the techniques described in Example 1. They were then coated at 460° C. and 40 Torr with tungsten for 35 minutes using 150 sccm of WF$_6$, 1,500 sccm of H$_2$, and 11,600 sccm of argon in run #261. After depositing tungsten they were coated further with tungsten carbide for 90 minutes at 460° C. and 40 Torr using 300 sccm of WF$_6$, 3000 sccm of H$_2$, 3,480 sccm of argon and 100 sccm of DME. These conditions provided H$_2$/WF$_6$ ratio of 10.0, W/C atomic ratio of 1.5 and DME partial pressure of 0.58 Torr. After the deposition reaction the coated specimens were heat treated for 1 hour at the deposition temperature under flowing argon gas.

The specimens were coated with a bright, smooth, adherent and coherent ~11μm thick columnar tungsten followed by ~14μm thick non-columnar, layered tungsten/tungsten carbide. The coating was absolutely free of cracks. The microstructure of the coating was similar to the one shown in FIG. 1. The top coat consisted of a mixture of W and W$_2$C, as determined by XRD.

This example shows that the use of W/C atomic ratio of 1.5 and/or DME partial pressure of 0.58 Torr during tungsten carbide deposition reaction result in the formation of a mixture of W and W$_2$C.

Example 4

A number of Ti/6Al/4V and AM-350 stainless steel flat specimens preplated with -3μm thick nickel were heated in a furnace using the techniques described in Example 1. They then were coated at 460° C. and 40 Torr with tungsten for 3 minutes using 150 sccm of WF$_6$, 1,500 sccm of H and 11,600 sccm of argon in run #504. After depositing tungsten they were coated further with tungsten carbide for 90 minutes using 300 sccm of WF$_6$, 3000 sccm of H$_2$, 3,190 sccm of argon and 150 sccm of DME. These conditions provided H$_2$/WF$_6$ ratio of 10.0, H/C atomic ratio of 1.0 and DME partial pressure of 0.90 Torr. After the deposition reaction with coated specimens were heat treated for 1 hour at the deposition temperature under flowing argon gas.

Figure 2:
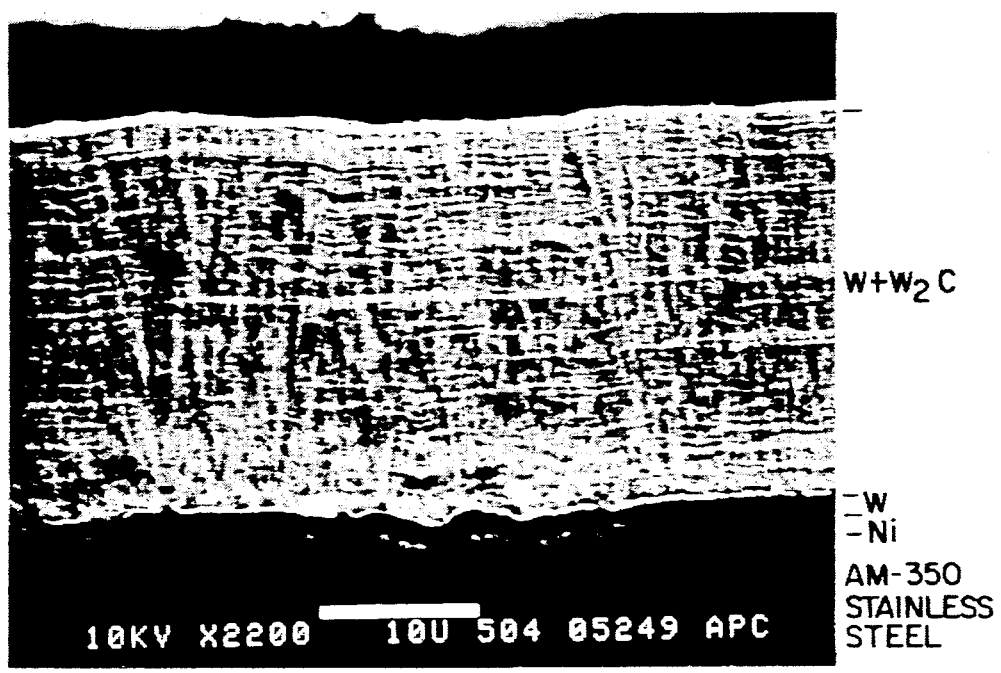
FIG. 2 is a photomicrograph, magnified 2200 times, of an etched cross section of a prior art coating comprising a ~1μm thick intermediate layer of columnar tungsten followed by ~24μm thick non-columnar outer coating of W plus $W_2C$ on AM-350 stainless steel.

The specimens were coated with a bright, smooth, adherent and coherent ~1μm thick tungsten followed by ~24μm thick non-columnar, layered tungsten/tungsten carbide, as shown in FIG. 2. The coating was heavily cracked. The top coat consisted of a mixture of W and W$_2$C, as determined by XRD.

This example shows that the use of W/C atomic ratio of 1.0 results in the formation of a mixture of N and W$_2$C. The use of low W/C atomic ratio in conjunction with low DME partial pressure therefore results in the formation of a mixture of W and W$_2$C.

Example 5

The CVD run described in Example 4 was repeated in run #507 using the identical conditions with the exception of using 60 minutes reaction time instead of 90 minutes during tungsten carbide deposition. The specimens were coated with ~1μm tungsten followed by ~16μm thick non-columnar, layered tungsten/tungsten carbide coating. The top coat consisted of a mixture of W and W$_2$C.

This example therefore confirmed that the use of W/C atomic ratio of 1.0 and DME partial pressure of 0.9 Torr result in the formation of a mixture of N and W$_2$C coating.

Examples Describing Deposition of WC$_{1-x}$ Coatings of the Present invention

Example 6

A number of graphite and nickel plated AM-350 stainless steel flat specimens were heated in the furnace described in Example 1. They were coated at 457° C. and 40 Torr with tungsten for 5 minutes using 300 sccm of WF$_6$ and 3,000 sccm of H$_2$ in run #28. After depositing tungsten they were coated further with tungsten carbide for 55 minutes using 300 sccm of WF$_6$, 3000 sccm of H$_2$ and 125 sccm of DME. The total pressure was maintained by 40 Torr during the reaction. These conditions provided H$_2$/WF$_6$ ratio of 10.0, W/C atomic ratio of 1.2 and DME partial pressure of 1.46 Torr. After the deposition reaction the specimens were heat treated for 1 hour at the deposition temperature under flowing argon gas.

The specimens were coated with a dull, smooth, adherent, coherent ~2μm thick columnar tungsten followed by ~2μm thick tungsten carbide. The top coat was extremely dense and void-free and crack-free. Furthermore, it showed neither a columnar nor a layered structure. It consisted of cubic WC$_{1-x}$, as determined by XRD.

This example shows that the use of a low W/C atomic ratio (~1.2) along with a high DME partial pressure (~1.46 Torr) result in the formation of a new tungsten carbide coating with entirely different microstructure and composition.

Example 7

A number of graphite, Ti/6Al/4V and AM-350 stainless steel specimens were heated in the furnace described in Example 1. The metallic specimens had been preplated with nickel using the techniques described above. They were coated at 460° C. and 40 Torr with tungsten for 20 minutes using 300 sccm of $WF_6$, 3000 sccm of $H_2$ and 6,525 sccm of argon o in run #87. After depositing tungsten they were coated further with tungsten carbide for 40 minutes using 300 sccm of $WF_6$, 3500 sccm of $H_2$ and 150 sccm of DME. A total pressure of 40 Torr was maintained during the reaction. These conditions provided $H_2/WF_6$ ratio of 11.67, W/C atomic ratio of 1.0 and DME partial pressure of 1.52 Torr. After the deposition reaction the specimens were heat treated for 1 hour at the deposition temperature under flowing argon gas.

Figure 3:
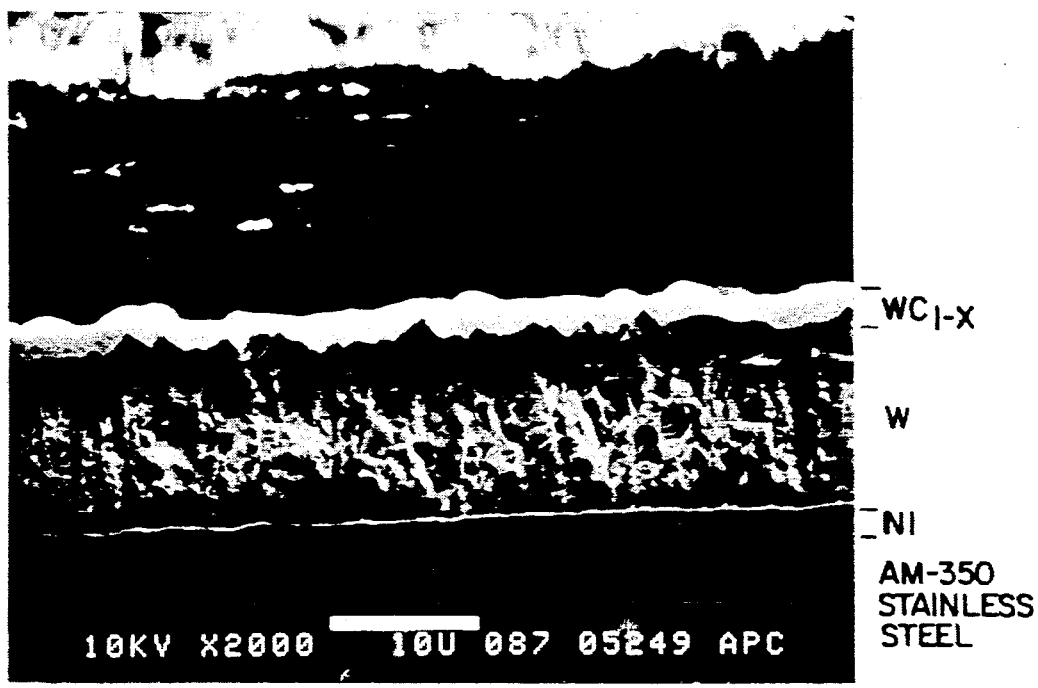
FIG. 3 is a photomicrograph, magnified 2000 times, of an etched cross section according to the present invention comprising a ~11μm thick intermediate layer of columnar tungsten followed by ~2μm thick non-columnar outer coating of cubic $WC_{1-x}$ on AM-350 stainless steel.

The specimens were coated with a dull, smooth, adherent and coherent ~11μm thick columnar tungsten followed by ~2μm thick non-columnar, dense, void-free and crack-free tungsten carbide, as shown in FIG. 3. The top coat consisted of cubic $WC_{1-x}$, as determined by XRD. The Auger Emission Spectroscopy (AES) depth profile of the top coat revealed it contained ~51 atomic % W and ~49 atomic % C. It did not contain any oxygen. Based upon the Auger analysis, the composition of the top coat was substantially equivalent to $WC_{0.96}$.

This example shows that a low W/C atomic ratio and a high DME partial pressure are required in the gaseous feed mixture to produce $WC_{1-x}$ coating.

Example 8

A number of graphite and nickel plated AM-350 stainless steel and Ti/6Al/4V flat specimens were heated in the furnace described in Example 1. They were coated at 475° C. and 40 Torr with tungsten for 10 minutes using 300 sccm of $WF_6$, 3000 sccm of $H_2$ and 6,525 sccm of argon in run #92. After depositing tungsten they were coated further with tungsten carbide for 40 minutes using 300 sccm of $WF_6$, 3500 sccm of $H_2$ and 150 sccm of DME. A total pressure of 40 Torr was maintained during the reaction. Those conditions provided $H_2/WF_6$ ratio of 11.67, W/C atomic ratio of 1.0 and DME partial pressure of 1.52 Torr. After the deposition reaction the specimens were heat treated at the deposition temperature for 1 hour under flowing argon gas.

The specimens were coated with a dull, smooth, adherent and coherent ~6μm thick columnar tungsten followed by ~2μm thick non-columnar, dense, void-free and crack-free tungsten carbide with microstructure similar to that shown in FIG. 3. The top coat consisted of cubic $WC_{1-x}$, as determined by XRD. The Auger Emission Spectroscopy (AES) depth profile of the top coat revealed it to contain ~50 atomic % W and ~50 atomic % C. Within the detection limit of AES, no oxygen was noted in the coating. Based upon Auger analysis, the composition of the top coat was substantially equivalent to WC.

This example shows that a low H/C atomic ratio and a high DME partial pressure are required in the gaseous feed mixture to produce $WC_{1-x}$ coating even at slightly higher temperature.

Example 9

A number of Ti/6Al/4V and AM-350 stainless steel flat specimens were heated in the furnace described in Example 1. Each of these specimens had been preplated with nickel using the techniques described above. They were coated at 460° C. and 40 Torr with tungsten for 30 minutes using 150 sccm of $WF_6$, 1,500 sccm of $H_2$ and 11,600 sccm of argon in run #409. After depositing tungsten they were coated further with tungsten carbide for 100 minutes at 460° C. and 40 Torr using 300 sccm of $WF_6$, 3000 sccm of $H_2$ and 150 sccm of DME. These conditions provided $H_2/WF_6$ ratio of 10.0, W/C atomic ratio of 1.0 and DME partial pressure of 1.74 Torr. After the deposition reaction the specimens were heat treated for 1 hour at the deposition temperature under flowing argon gas.

Figure 4:
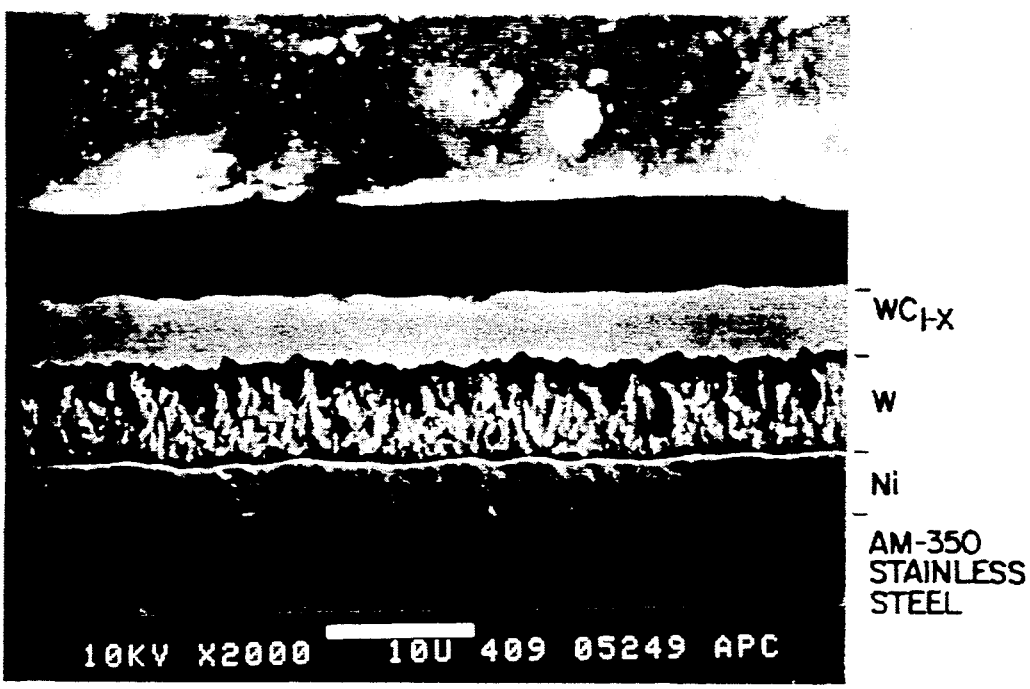
FIG. 4 is a photomicrograph, magnified 2000 times, of an etched cross section according to the present invention comprising a ~7μm thick intermediate layer of columnar tungsten followed by ~5μm thick non-columnar coating of W plus $W_2C$ followed by ~4μm thick non-columnar outer coating of cubic $WC_{1-x}$ on AM-350 stainless steel.

The specimens were coated with a dull, smooth, adherent and coherent ~7μm thick columnar tungsten followed by ~5μm thick non-columnar, dense, void-free and crack-free tungsten carbide with microstructure shown in FIG. 4. The top coat consisted of cubic $WC_{1-x}$, as determined by XRD.

This example shows that a low W/C atomic ratio and a high DME partial pressure are required in the gaseous feed mixture to produce $WC_{1-x}$ coating.

Example 10

This example shows the deposition of a three layered coating. A number of Ti/6Al/4V and AM-350 stainless steel flat specimens as well as SS-422 and AM-355 stainless steel discs were heated in the furnace described in Example 1. These flat specimens and discs had been preplated with nickel using the techniques described above. They were first coated at 460° C. and 40 Torr with tungsten for 25 minutes using 150 sccm of $WF_6$, 1,500 sccm of $H_2$ and 11,600 sccm of argon in run #435. After depositing tungsten they were then coated with a mixture of W and $W_2C$ coating for 30 minutes using 300 sccm of $WF_6$, 3000 sccm of $H_2$, 3,190 sccm of argon and 95 sccm of DME. Finally, they were coated with $WC_{1-x}$ for 70 minutes using 300 sccm of $WF_6$, 3000 sccm of $H_2$ and 150 sccm of DME. These conditions provided $H_2/WF_6$ ratio of 10.0, W/C atomic ratio of 1.0 and DME partial pressure of 1.74 Torr. After the deposition the specimens were heat treated for 1 hour at the deposition temperature under flowing argon gas.

Figure 5:
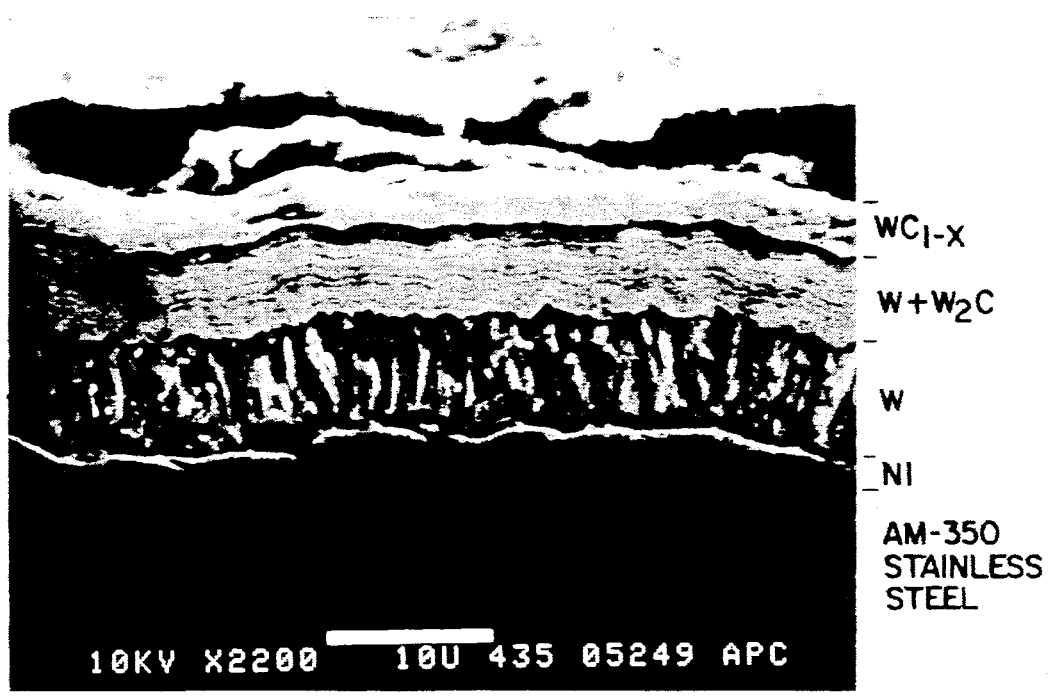
FIG. 5 is a photomicrograph, magnified 2200 times, of an etched cross section according to the present invention comprising a ~7μm thick intermediate layer of columnar tungsten followed by ~5μm thick non-columnar coating of W plus $W_2C$ followed by ~4μm thick non-columnar outer coating of cubic $WC_{1-x}$ on AM-350 stainless steel.

The specimens and discs were coated with a dull, smooth, adherent and coherent ~7μm thick columnar tungsten followed by ~5μm thick non-columnar, layered and a mixture of W and $W_2C$ and finally by a ~4μm thick non-columnar, void-free, crack-free and dense $WC_{1-x}$, as shown in FIG. 5. The top coat consisted of cubic $WC_{1-x}$, as determined by XRD. The Auger Emission Spectra (AES) depth profile of the top coat revealed it to contain ~51 atomic % W and ~49 atomic % C. Within the detection limits of the technique (>0.1 atomic %), no oxygen was observed in the top coat. Based upon the Auger analysis, the composition of the top coat was substantially equivalent to $WC_{0.96}$.

This example shows that $WC_{1-x}$ coating can be deposited at the top of other tungsten carbide coating%. Furthermore, it shows that a low W/C atomic ratio and a high DME partial pressure in the gaseous feed mixture are required to produce $WC_{1-x}$.

Example 11

A number of nickel preplated Ti/6Al/4V and AM-350 stainless steel flat specimens were heated in the furnace described in Example 1. They were then coated at 460° C. and 40 Torr with tungsten for 3 minutes using 150 sccm of $WF_6$, 1,500 sccm of $H_2$ and 11,600 sccm of argon in run #505. They were then coated further with tungsten carbide for 60 minutes at 460° C. and 40 Torr using 300 sccm of $WF_6$, 750 sccm of $H_2$, 3,190 sccm of argon and 150 sccm of DME. These conditions provided $H_2/WF_6$ ratio of 2.5, W/C atomic ratio of 1.0, and DME partial pressure of 1.37 Torr. After the deposition the specimens were heat treated for 1 hour at the deposition temperature under flowing argon gas. The specimens were coated with a dull, smooth, adherent and coherent ~1μm thick tungsten followed by ~1μm thick non-columnar, void-free and crack-free $WC_{1-x}$. This example shows that $WC_{1-x}$ coating can be deposited using low W/C atomic ratio and high DME partial pressure even in the presence of 2.5 $H_2/WF_6$ ratio.

Example 12

A number of Ti/6Al/4V and AM-350 stainless steel flat specimens i preplated with nickel were coated with tungsten in run #506 using the furnace and conditions similar to the ones used in Example 11. The specimens were then coated with tungsten carbide for 90 minutes at 460° C. and 40 Torr using 300 sccm of $WF_6$, 1,500 sccm of $H_2$, 3,190 sccm of argon and 150 sccm of DME. These conditions provided $H_2/WF_6$ ratio of 5.0, W/C atomic ratio of 1.0, and DME partial pressure of 1.17 Torr. After the deposition the specimens were heat treated for 1 hour at the deposition temperature under flowing argon gas.

The specimens were coated with a dull, smooth, adherent and coherent ~1μm thick tungsten followed by ~2μm thick non-columnar, void-free and crack-free $WC_{1-x}$. This example shows that $WC_{1-x}$ coating can be deposited using low W/C atomic ratio and high DME partial pressure even in the presence of 5.0 $H_2/WF_6$ ratio.

Example 13

A number of Ti/6Al/4V and AM-350 stainless steel flat specimens preplated with nickel were heated in the furnace described in Example 1. They were coated at 425° C. and 40 Torr with tungsten for 20 minutes using 100 sccm of $WF_6$, 1,000 sccm of $H_2$ and 11,600 sccm of argon in run #528. They were then coated with tungsten carbide for 180 minutes at 425° C. and 40 Torr using 300 sccm of $WF_6$, 750 sccm of $H_2$, 3,190 sccm of argon and 150 sccm of DME. These conditions provided $H_2/WF_6$ ratio of 2.5, W/C atomic ratio of 1.0, and DME partial pressure of 1.37 Torr. After the deposition the specimens were heat treated for 1 hour at the deposition temperature under flowing argon gas.

The specimens were coated with a dull, smooth, adherent and coherent ~2.5μm thick columnar tungsten followed by -2&tm thick non-columnar, void-free and crack-free $WC_{1-x}$. This example shows that $WC_{1-x}$ coating can be deposited using low W/C ratio and high DME partial pressure even in the presence of 2.5 $H_2/WF_6$ ratio and low temperature.

Example Describing the Use of Diethyl Ether (DEE) as a Carbon Source for Depositing Prior Art Mixture of W, $W_2C$ and $W_3C$

Example 14

A number of Ti/6Al/4V and AM-350 stainless steel flat specimens preplated with nickel were heated in the furnace described in Example 1. They were coated at 460° C. and 40 Torr with tungsten for 35 minutes using 150 sccm of $WF_6$, 1,500 sccm of $H_2$ and 10,875 sccm of argon in run #262. After depositing tungsten they were coated further with tungsten carbide for 100 minutes using 200 sccm of $WF_6$, 2,000 sccm of $H_2$, 5,220 sccm of argon and 30 sccm of diethyl ether (DEE). These conditions provided $H_2/WF_6$ ratio of 10.0, W/C atomic ratio of 1.67 and DEE partial pressure of 0.16 Torr. After the deposition reaction the coated specimens were heat treated for 1 hour at the deposition temperature under flowing argon gas.

The specimens were coated with a bright, smooth, adherent and coherent ~9μm thick columnar tungsten followed by ~7μm thick non-columnar, layered tungsten/tungsten carbide coating. The top coat consisted of a mixture of W, $W_2C$ and $W_3C$, as determined by XRD.

This example shows that a high W/C atomic ratio and a low DEE partial pressure result in the deposition of a mixture of tungsten and tungsten carbide coating.

Example Describing the Use of DEE to Deposit $WC_{1-x}$ Coating of this Invention

Example 15

A number of Ti/6Al/4V and AM-350 stainless steel flat specimens preplated with nickel were coated with tungsten in run #255 using the furnace and conditions similar to the ones used in Example 14. The specimens were then coated with tungsten carbide for 100 minutes at 460° C. and 40 Torr using 200 sccm of $WF_6$, 2,000 sccm of $H_2$, 5,220 sccm of argon and 50 sccm of DEE. These conditions provided $H_2/WF_6$ ratio of 10.0, W/C atomic ratio of 1.0, and DEE partial pressure of 0.27 Torr. After the deposition reaction the coated specimens were heat treated for 1 hour at deposition temperature under flowing argon gas.

The specimens were coated with a dull, smooth, coherent and adherent ~10μm thick columnar tungsten followed by ~2μm thick non-columnar, dense, void-free, and crack-free $WC_{1-x}$. The AES depth profile of the coating revealed it to contain ~55 atomic % W and ~45 atomic % C. Within the detection limit of the technique, no oxygen was observed in the coating. Based upon the Auger analysis, the composition of the top coat was substantially equivalent to $WC_{0.82}$. The microstructure of the coating was very similar to the one shown in FIG. 3.

This example shows that a low W/C atomic ratio and a high DEE partial pressure can be used to deposit $WC_{1-x}$ coating. It also shows that oxygenated hydrocarbons other than DME can be used to deposit $WC_{1-x}$.

Example Describing Wear Performance of Uncoated and Coated SS-422 Discs

Example 16

The friction and wear resistance properties of uncoated SS-422 stainless o steel discs and the ones coated with $W+W_2C$ coating in Example 2 and $WC_{1-x}$ coating in Example 10 were determined using a ball-on-disc tribometer by the Centre Suisse d'Electronique et de Microtechnique S. A. (CSEM), Neuchatel, Switzerland. The uncoated and coated discs were polished to a smooth surface finish prior to the friction and wear tests. The tests were carried out using a combination of an uncoated, hardened 52-100 chromium steel ball and an uncoated or coated disc at a constant load of 5N and a relative surface velocity of 10 cm/sec. The total wear was determined by measuring the wear on the ball contact surface using an optical microscopy and by determining the wear on the disc with a profilometer. The tests were performed in a humid environment (99% relative humidity) and in the presence of a poor lubricant such as cutting fluid.

The test results summarized in Tables 1 and 2 showed that $WC_{1-x}$ coated disc resulted in considerably lower friction coefficient than $W+W_2C$ coating both in humid and lubricated environments. The friction coefficient was similar to the uncoated disc in humid environment, but it was considerably lower in the presence of cutting fluid. The wear resistance of $WC_{1-x}$ coating was far superior to those of uncoated and $W+W_2C$ coated discs both in humid and lubricated environments.

This example shows that $WC_{1-x}$ coating described in the present invention provides excellent wear resistance in lubricated and unlubricated environments.

TABLE 1

| Friction and Wear Test Results in Humid Environment | | | | |
| --- | --- | --- | --- | --- |
| Specimen | Example No. | Friction Coefficient | Wear Rate, $10^{-15}$ m$^2$/N | | |
| | | | Disc | Ball | Total |
| Uncoated SS-422 Disc | N/A | 0.49 | 1.0 | 7.1 | 8.1 |
| $W + W_2C$ Coated SS-422 Disc | 2 | 0.98 | 0.7 | 2.6 | 3.3 |
| $WC_{1-x}$ Coated SS-422 Disc | 10 | 0.55 | 0.4 | 0.8 | 1.2 |

TABLE 2

| Friction and Wear Test Results in the Presence of Cutting Fluid | | | | | |
| --- | --- | --- | --- | --- | --- |
| Specimen | Example No. | Friction Coefficient | Wear Rate, $10^{-15}$ m$^2$/N | | |
| | | | Disc | Ball | Total |
| Uncoated SS-422 Disc | N/A | 0.15 | 2.8 | 0.04 | 2.84 |
| $W + W_2C$ Coated SS-422 Disc | 2 | 0.12 | 0.77 | 0.24 | 1.00 |
| $WC_{1-x}$ Coated SS-422 Disc | 10 | 0.015 | 0.02 | 0.02 | 0.04 |

X-ray Diffraction (XRD) Instrumental Apparatus and Experimental Procedures

Diffraction experiments were performed on Siemens D500 diffractometer using a graphite-monochromatized Cuket radiation ($\lambda = 1.54178$ Å) source. The X-ray tube was operated at 40KV and 30mA. The flat specimens were scanned in symmetric reflection geometry using Bragg-Brentano parafocusing optics. The dimensions of the collimation system were as follows: $1 \times 10$ mm$^2$ line focus viewed at a 6° take-off angle; 1° fixed divergence slit; 1° scatter slits; a Soller slit which limited axial divergence to 2°; 0.15° detector slit; and 0.15° monochromator slit. Data output was either by strip-chart recording or in the form of digitized diffraction traces which were stored in an IBM-PC/AT computer.

Diffraction scans were made for the purposes of phase identification and measuring crystallite size. Survey scans over a wide angular range at rapid scan rates were obtained initially. The scan range was normally 5° to 105° in $2\theta$ where $2\theta$ is the diffraction angle. In the strip-chart scans, the scan rates were normally 2°/min or 5°/min. In the computer-controlled scans, the following scan parameters were used: 0.032° step size; 1 sec count time per step; and continuous step-scan mode. If there was some doubt about the presence of a weakly-diffracting phase, scans were repeated at a slower scan rate. d-spacings were calculated employing the Bragg equation:

$$\lambda = 2d \sin \theta.$$

Diffraction angles and relative peak intensities were estimated by eye from the strip-chart recordings or were found automatically using peak-finding software.

Phases were identified manually by comparing observed d-spacings and relative peak intensities with those of a reference pattern of $WC_{1-x}$ found in the Powder Diffraction File (PDF) card 20-1316. Because of preferred crystallite orientation, more attention was paid to the positions of lines than to their intensities.

The crystallite size was estimated using the Scherrer equation*:

$$\text{Crystallite size} = c\lambda/(\beta \cos \theta), \tag{2}$$

where c is a constant set to 0.9 and $$\beta = (\beta^2_1 - \beta^2_0)^{\frac{1}{2}}, \tag{3}$$

where $\beta_1$ is the full width of a half-maximum (FWHM) of an observed diffraction line and $\beta_0$ is the FWHM of a diffraction line of a highly-crystalline reference material. The reference material used was Linde C alumina. $\beta_0$ was obtained by linear interpolation between the FWHM's of reference diffraction lines whose $\theta$-values spanned that of the observed line. In our calculations, we assumed implicitly that the sole source of specimen line broadening was small crystallite size.

*B. D. Cullity, "Elements of X-ray Diffraction" (Reading, Mass: Addison-Wesley, 1978), p. 284

Interpretation of XRD Results

Figure 6:
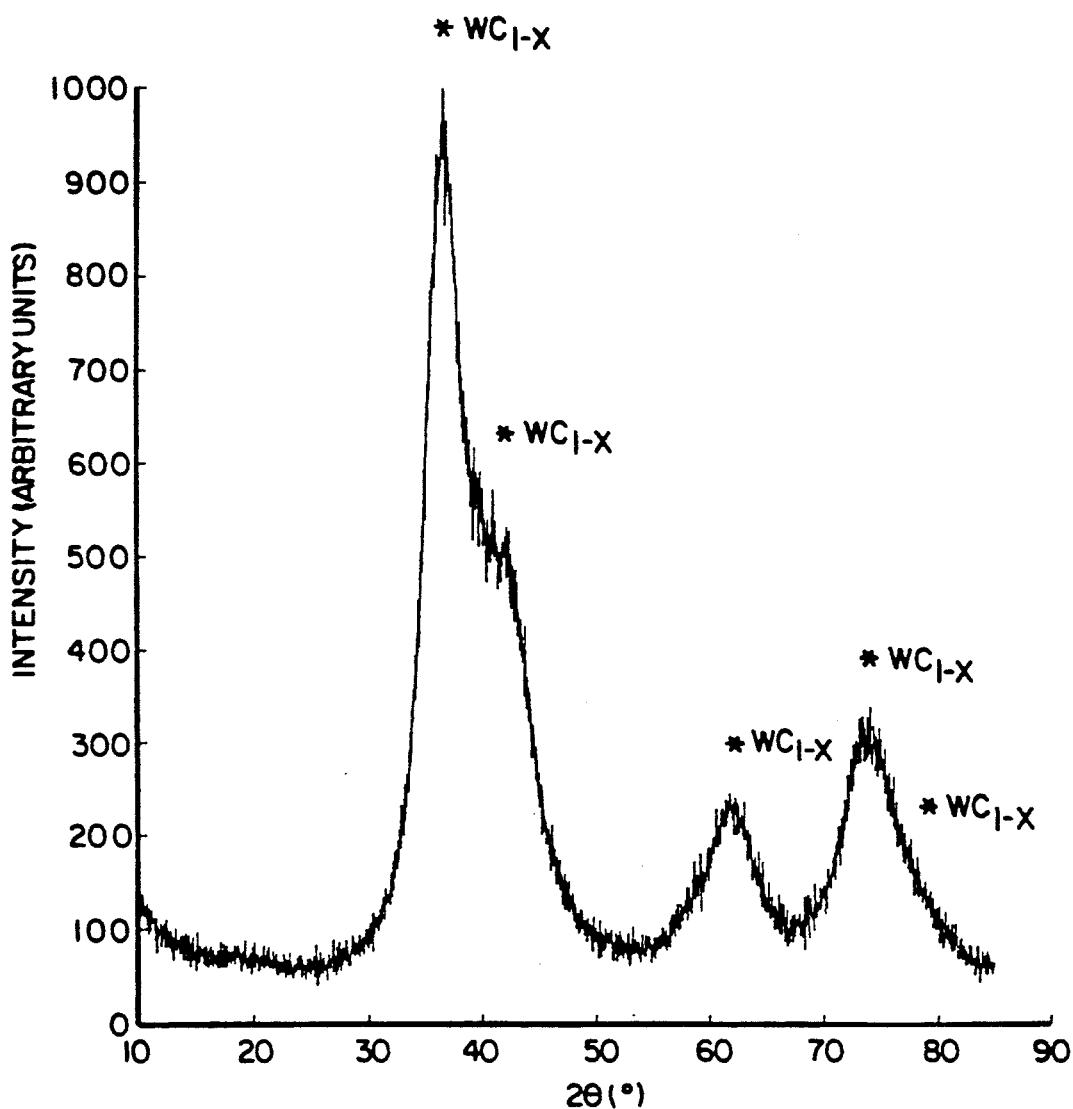
FIG. 6 is an x-ray diffraction scan of a $WC_{1-x}$ coating of the present invention.

A typical scan of a $WC_{1-x}$ coating is shown in FIG. 6. The pattern contains extremely diffuse reflections characteristic of the $WC_{1-x}$ phase, as given in PDF card 20-1316. The relative peak intensities indicate that the $WC_{1-x}$ phase has strong (111) preferred orientation. The crystallite size is very small, falling somewhere between 20 and 30Å.

Discussion

Figure 7:
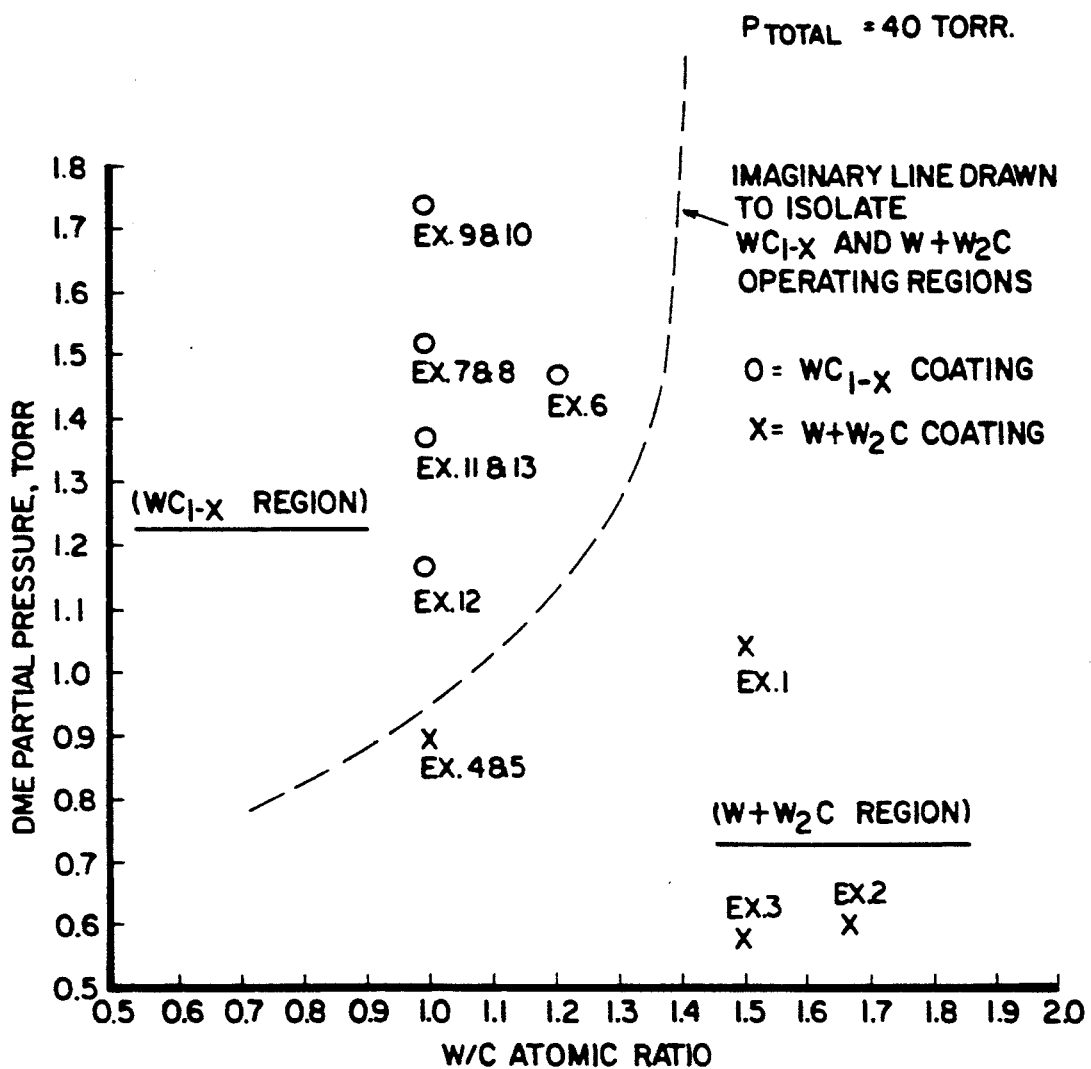
FIG. 7 is a graph showing the relationship between W/C atomic ratio and dimethyl ether (DME) partial pressure upon the coating composition.

The effect of W/C atomic ratio and DME partial pressure upon coating composition is presented in FIG. 7. The data plotted in this figure clearly show two different operating regimes for producing a mixture of W and $W_2C$ and $WC_{1-x}$ coatings at a total operating pressure of 40 Torr. The regime for producing $WC_{1-x}$ is as DME partial pressure of at least 1.1 Torr. These regimes may change with the operating temperature and total pressure. Similar regimes can be found for different oxygen-containing hydrocarbons.

Conclusion

Thus it can be seen that the present invention discloses the deposition of a fine grained, non-columnar, void-free and crack-free cubic tungsten carbide coating which consists essentially of $WC_{1-x}$. As discussed in the foregoing examples, this new product exhibited much lower friction coefficient and better wear resistance than the prior art non-columnar and layered $W + W_2C$ in both humid and lubricated environments.

Various modifications of the invention in addition to those shown and described herein will become apparent to those skilled in the art from the foregoing description and examples. Such modifications are intended to fall within the scope of the appended claims.

What is claimed is:

1. A coated substrate comprising a substrate selected from the group consisting of ferrous and non-ferrous metals, alloys, graphite, cemented carbides and ceramics having a fine-grained coating thereon wherein said coating consists essentially of tungsten carbide characterized by the formula $WC_{1-x}$, where x ranges from 0 to about 0.4, said coating on said coated substrate being essentially free of columnar grains.

2. The product according to claim 1 wherein said product consists essentially of fine, homogeneous and equiaxial grains.

3. The product according to claim 1 wherein said substrate is a metal or alloy which is reactive with process gases comprising (1) a tungsten halide, (2) a volatile oxygen- and hydrogen-containing organic compound containing from one to four carbon atoms, and (3) hydrogen and wherein an interlayer of a noble metal selected from the group consisting of nickel, cobalt, copper, silver, gold, platinum, rhodium, iridium and palladium is deposited between said substrate and said tungsten carbide phase.

4. The coated substrate according to claim 1 wherein the substrate is selected from the group consisting of copper, nickel, cobalt, silver, gold, molybdenum, rhenium and graphite.

5. A coated substrate comprising a substrate selected from the group consisting of ferrous and non-ferrous metals, alloys, graphite, cemented carbides and ceramics having a fine-grained coating on the substrate, wherein said coating consists essentially of a mixture of tungsten phase and a carbide phase wherein said carbide phase is selected from the group consisting of (1) $W_2C$, (2) $W_3C$, and (3) a mixture of $W_2C + W_3C$, and a fine-grained second coating on the coated substrate consisting essentially of a mixture of a tungsten carbide characterized by the formula $WC_{1-x}$, where x ranges from 0 to about 0.4, said second coating on said coating substrate product being essentially free of columnar grains.

6. The product according to claim 5 wherein a chemical vapor deposited coating of columnar tungsten is deposited on said substrate prior to said fine-grained coating of said tungsten phase and a carbide phase.

7. The product according to claim 6 wherein said substrate is a metal or alloy which is reactive with process gases comprising (1) a tungsten halide and (2) hydrogen and wherein an interlayer of a nobel metal selected from the group consisting of nickel, cobalt, copper, silver, gold, platinum, rhodium, iridium and palladium is deposited between said substrate and said columnar tungsten coating.

8. The product according to claim 5 wherein an interlayer of a nobel metal selected from the group consisting of nickel, cobalt, copper, silver, gold, platinum, rhodium, iridium and palladium is deposited between said substrate and said fine-grained coating of tungsten phase and a carbide phase.

9. The product according to claim 5 wherein said product consists essentially of homogeneous and equiaxial grains.

10. The coated substrate according to claim 5 wherein the substrate is selected from the group consisting of copper, nickel, cobalt, silver, gold, molybdenum, rhenium and graphite.

* * * * *